United States Patent [19]

Gelorme et al.

[11] Patent Number: 5,605,781
[45] Date of Patent: Feb. 25, 1997

[54] PHOTOSENSITIVE COMPOSITION WITH CYANATE ESTERS AND USE THEREOF

[75] Inventors: Jeffrey D. Gelorme; Eugene R. Skarvinko, both of Binghamton; David W. Wang, Vestal, all of N.Y.

[73] Assignee: International Business Machines Corporation, Armonk, N.Y.

[21] Appl. No.: 483,976

[22] Filed: Jun. 7, 1995

Related U.S. Application Data

[62] Division of Ser. No. 348,944, Nov. 25, 1994, Pat. No. 5,464,726, which is a division of Ser. No. 382,311, Jul. 20, 1989, abandoned.

[51] Int. Cl.⁶ .......................... G03F 7/0269; G03F 7/039; G03F 7/004
[52] U.S. Cl. .................... 430/280.1; 430/283.1; 430/270.1; 522/15; 522/25; 522/31; 522/173; 522/167; 522/126; 522/146
[58] Field of Search ...................... 430/270, 280, 430/283, 270.1, 280.1, 283.1; 522/15, 25, 31, 173, 167, 126, 146

[56] References Cited

U.S. PATENT DOCUMENTS

| | | | |
|---|---|---|---|
| 3,694,410 | 9/1972 | Ochmke | 260/47 R |
| 4,028,393 | 6/1977 | Rottloff et al. | 260/453 |
| 4,110,364 | 8/1978 | Gaka et al. | 430/283.1 |
| 4,383,903 | 5/1983 | Ayano et al. | 430/285.1 |
| 4,528,366 | 7/1985 | Woo et al. | 528/422 |
| 4,876,153 | 10/1989 | Thorfinnson | 428/447 |
| 5,215,860 | 6/1993 | McCormick et al. | 430/270.1 |

OTHER PUBLICATIONS

Bogan et al, 110:174276, abstracts from Chemical Abstracts of "Unique polyaromatic cyanate ester fro low dielectric printed circuit boards", Sample Journal, (1988), vol. 24, No. 6, pp. 19–25. 1985.

Meier et al, "Photo initiated Cationic Pholymerization of Epoxides with Iron–Arene Complexes", Journal of Radiation curing Oct. 1986. pp. 27–31. 1986.

Jerry March, Advanced Organic Chemistry: Reactions, Mechanisms and Structure, second edition, McGraw–Hill Boo Company, New York, NY 1977, pp. 225-245. 1977.

*Primary Examiner*—Cynthia Hamilton
*Attorney, Agent, or Firm*—Law Offices Pollock, Vande Sande & Priddy

[57] ABSTRACT

A photosensitive composition containing a curable cyanate ester and a cationic photoinitiator; and use thereof to form a resist image.

15 Claims, No Drawings

PHOTOSENSITIVE COMPOSITION WITH CYANATE ESTERS AND USE THEREOF

This is a divisional application of U.S. Ser. No. 08/348,944, filed Nov. 25, 1994, which matured into U.S. Pat. No. 5,464,726 on Nov. 7, 1995, which is a divisional of application of U.S. Ser. No. 07/382,311, filed Jul. 20 1989, now abandoned.

DESCRIPTION

1. Technical Field

The present invention is concerned with photosensitive compositions and particularly with photosensitive compositions that can act as positive or negative resists, depending upon the type of photoinitiator employed.

Moreover, the present invention is especially concerned with cationically initiated photosensitive compositions which are thermosetting.

In addition, the present invention is directed to the production of resist images employing the photosensitive compositions.

2. Background Art

One widely used method for forming a pattern such as metallic circuitry on a substrate in the manufacture of printed circuit boards in integrated circuits is to imagewise form a pattern of photoresist material over those areas of the substrate or over a metal-coated substrate to be shielded from metal deposition or metal removal. The photoresist layer is normally formed of a polymeric, organic material that is substantially unaffected by the metal deposition or metal removal process and, accordingly, protects the underlying areas.

The pattern is formed by imagewise exposing the photoresist material to actinic light through a photographic image, such as a glass master, by photolithographic techniques. The actinic light employed is usually X-ray, U.V. radiation, or electron beam radiation.

A number of photoresist materials are well-known and are capable of forming desired masking pattern. However, providing compositions which exhibit acceptable imaging (resolution and acuity) characteristics to be suitable as an image or pattern mask, especially for integrated circuits, along with the ability to tailor the composition to providing either a positive or negative resist, is quite unusual.

Also, providing such compositions with the ability to achieve a permanent protective coating is even that much more difficult.

In the manufacture of printed circuit boards and cards it is desirable that the photosensitive material used be patternable by means of photolytic process as is the practice with photoresists and which also, unlike most photoresists, can be retained to perform one or more additional functional uses during or after fabrication of the circuit board.

SUMMARY OF INVENTION

It has been found, according to the present invention, that cyanate esters can be rendered photosensitive by mixing with a cationic photoinitiator. It has also been found, according to the present invention, that photosensitive compositions containing cyanate esters are capable of performing such functions as permanently retained etch mask, solder mask, plating mask, dielectric film, and protective coating.

In particular, it has been found that photoprocessable coatings of the present invention not only exhibit good o, resolution (e.g., sharply defined acuity), but also possess excellent mechanical properties and especially high temperature resistance, making such available use as a solder mask. Such are capable of withstanding the temperatures experienced (e.g., about 360° C.) when joining an integrated circuit chip(s) to a card or board by soldering.

In addition, the present invention makes it possible to provide positive or negative resist, depending upon the type of photoinitiator selected.

In particular, the present invention is concerned with photosensitive composition that contains a curable cyanate ester and a cationic photoinitiator.

In addition, the present invention is concerned with a method for the production of a resist image which includes providing on a substrate a photosensitive composition. The photosensitive composition contains a curable cyanate ester and a cationic photoinitiator. The composition is imagewise exposed in a predetermined pattern to actinic light and developed to thereby provide the resist image.

BEST AND VARIOUS MODES FOR CARRYING OUT THE INVENTION

The cyanate esters employed pursuant to the present invention have two or more —O—C≡N groups and are curable through cyclization as contrasted to free radical curable materials that contain ethylenic or acetylenic unsaturation. Accordingly, the cyanate esters employed in the present invention are free from ethylenic and acetylenic unsaturation.

The cyanate esters can be monomeric or preferably polymeric, including oligomers and can be represented by those materials containing the following group:

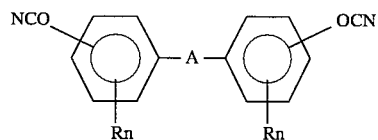

wherein A represents independently a simple bond, —S—, —S—S—, —SO—, —SO$_2$—, —CO—, —CO$_2$—, —O—, —C(CF$_3$)$_2$—, divalent alkylene radicals such as —CH$_2$— and —C(CH$_3$)$_2$—; divalent alkylene radicals substituted with heteroatom such as O, S, and N; divalent alkylene radicals interrupted by heteroatoms in the chain such as O, S, and N; divalent cyclicalkylene groups and divalent arylene groups.

Each R is independently selected from the group of hydrogen, alkyl containing 1 to 9 carbon atoms, aryl containing 6 to 14 carbon atoms, alkaryl containing 6 to 14 carbon atoms, and halogen.

Each n independently is an integer of 0 to 4.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference. Some examples of suitable cyanate esters are 4,4'-dicyanatodiphenyl, 2,2'-dicyanatodiphenyl, 3,3',5,5'-tetramethyl-4,4'-dicyanatodiphenyl, 3,3',5,5'-tetrachloro-4,4'-dicyanatodiphenyl, 3,3',5,5'-tetrachloro-2,2'-dicyanatodiphenyl, 2,2',6,6'-tetrachloro-4,4'-dicyanatodiphenyl, 4,4'- bis-[(3-cyanato)-phenoxy]diphenyl, 4,4'-bis-[(4-cyanato)-phenoxy]-diphenyl; 2,2'-dicyanato-1,1'-binaphthyl; 4,4'-dicyanatodiphenyl ether, 3,3',5,5'-tetramethyl-4,4'-dicyanatodiphenyl ether, 3,3',5,5'-tetrachloro-4,4'-dicyanatodiphenyl ether, 4,4'-bis-[p-cyanatophenoxy]-diphenyl ether, 4,4'-bis-[p-cyanatophenylisopropyl]-diphenyl ether, 4,4'-bis-[p-cyanatophenoxy]-benzene, 4,4'-bis-[m-cyanatophenoxy]diphenyl ether, 4,4'-bis-[4-(4-cyanatophenoxy)-phenyl sulphone]-diphenyl ether; 4,4'-dicyanatodiphenyl sulphone, 3,3',5,5'-tetramethyl-4,4'-dicyanatodiphenyl sulphone, 3,3',5,5'-tetrachloro-4,4'-dicyanatodiphenyl sulphone, 4,4'-bis-[p-cyanatophenylisopropyl]-diphenyl sulphone, 4,4'-bis-[(4-cyanato)-phenoxy]-diphenyl sulphone, 4,4'-bis-[(3-cyanato)-phenoxy]-diphenyl sulphone, 4,4'-bis-[4-(4-cyanatophenylisopropyl)phenoxy]-diphenyl sulphone, 4,4'-bis-[4-cyanatophenyl sulphone)-phenoxy]-diphenyl sulphone, 4,4'-bis-[4-(4cyanato)-diphenoxy]-diphenylsulphone; 4,4'-dicyanatodiphenyl sulfide, 4,4'-dicyanatodiphenyl methane, 4,4'-bis-[p-cyanatophenyl]-diphenyl methane, 2,2-bis-(p-cyanatophenyl)-propane, 2,2-bis-(3,5-dimethyl-4-cyanatophenyl)-propane, 2,2-bis-(3,5-dichloro-4-cyanatophenyl)-propane, 1,1-bis-[p-cyanatophenyl]-cyclohexane, bis-[2-cyanato-1-naphthyl]methane, 1,2-bis-[p-cyanatophenyl]-1, 1,2,2-tetramethyl ethane, 4,4'-dicyanatobenzophenone, 4,4'-bis(4-cyanato)phenoxybenzophenone, 1,4-bis-[p-cyanatophenylisopropyl]benzene, 2,2',5,5'-tetracyanatodiphenyl sulphone; 2,2-bis (p-cyanatophenyl) hexafluoropropane; polycyanic acid esters of novolacs (reaction products of phenol or alkyl- or halogen-substituted phenols with formaldehyde in acid solution) having from 3 to 5 OCN groups. Preferably, prepolymers including oligomers are employed as the cyanate esters. An example of a suitable polyaromatic cyanate ester containing cycloaliphatic bridging group between aromatic rings is available from Dow Chemical Company under the designation "Dow XU-71787.OOL" cyanate. A discussion of such can be found in Bogan, et al., "Unique Polyaromatic Cyanate Ester for Low Dielectric Printed Circuit Boards", *Sampe Journal*, Vol. 24, No. 6, Nov/Dec 1988.

The compositions of the present invention also contain a photoinitiator and especially cationic initiators. In the event a positive working photoresist composition is desired, the photoinitiator employed is one which will generate a Bransted acid upon exposure to actinic light. Examples of such photoinitiators are well-known and include onium salts and especially Group VIA and Group VIIA salts such as the pyrylium, selenonium, sulfonium, and iodonium salts. Various suitable photoinitiators are discussed in U.S. Pat. Nos. 4,161,478; 4,442,197; 4,139,655; 4,400,541; 4,197,174; 4,173,476; and 4,299,938; and European patent application 44/0094914 and 84/0126712, disclosures of which are incorporated herein by reference.

Also see Watt, et al., "A Novel Photoinitiator of Cationic Polymerization: Preparation and Characterization of Bis[4-(diphenylsulfonio)phenyl]-sulfide-Bis-Hexafluorophosphate", *Journal of Polymer Science: Polymer Chemistry Edition*, Vol. 22, p. 1789, 1980 John Wiley & Sons, Inc.

Additional discussions concerning sulfonium and iodonium salts can be found, for instance, in Crivello, et al., "Complex Triarylsulfonium Salt Photoinitiators. II. The Preparation of Several New Complex Triarylsulfonium Salts and the Influence of Their Structure in Photoinitiated Cationic Polymerization", *Journal of Polymer Science: Polymer Chemistry Edition*, Vol. 18, pp. 2697–2714 (1980), John Wiley & Sons, Inc.; Pappas, et al., "Photoinitiation of Cationic Polymerization. III. Photosensitization of Diphenyliodonium and Triphenylsulfonium Salts", *Journal of Polymer Science: Polymer Chemistry Edition*, Vol. 22, pp. 77–84, (1984), John Wiley & Sons, Inc.; Crivello, et al., "Photoinitiated Cationic Polymerization with Triarylsulfonium Salts", *Journal of Polymer Science: Polymer Chemistry Edition*, Vol. 17, pp. 977–999, (1979), John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators" *Journal of Polymer Science: Polymer Chemistry Edition*, Vol. 18, pp. 2677–2695, (1980), John Wiley & Sons, Inc.; and Crivello, "Cationic Polymerization—Iodonium and Sulfonium Salt Photoinitiators" *Advances in Polymer Science*, Series #62, pp. 1–48 (1984), Springer-Verlag.

Examples of some sulfonium salts are arylacyldialkyl and hydroxyaryldialkyl sulfonium salts represented by the following formulae:

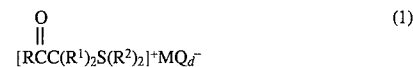

(1)

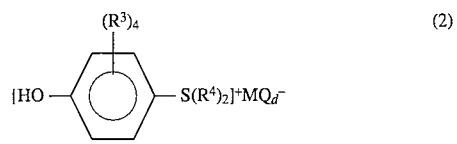

(2)

where R is a $C_{(6-13)}$ monovalent aromatic organic radical or substituted $C_{(6-13)}$ monovalent aromatic organic radical; $R^1$ is a monovalent radical selected from hydrogen, $C_{(1-8)}$ alkyl and mixtures thereof; $R^2$ is a $C_{(1-13)}$ monovalent organic radical; $R^3$ is a monovalent radical selected from $C_{(1-8)}$ alkyl, hydroxy, $C_{(1-8)}$ alkoxy, halo and nitro; $R^4$ is a $C_{(1-8)}$ alkyl radical; M is a metal or metalloid; Q is halogen; and d is equal to 4–6.

Examples of arylacyldialkyl sulfonium salts are:

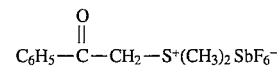

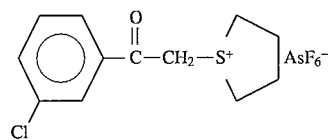

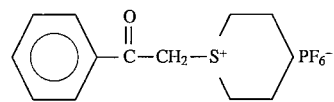

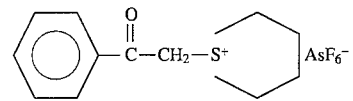

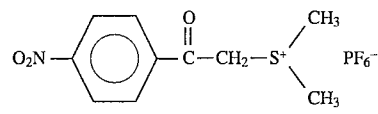

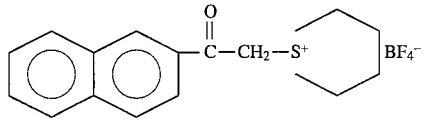

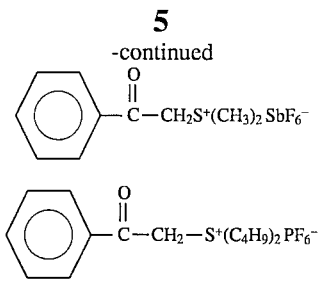
Examples of some hydroxyaryl dialkyl sulfonium salts are:
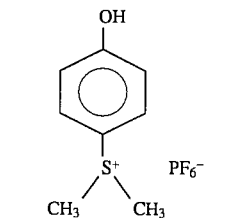
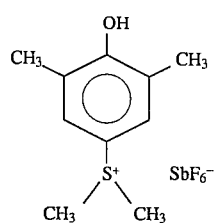
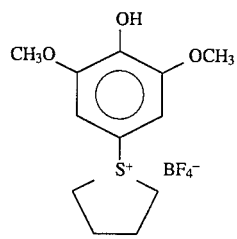
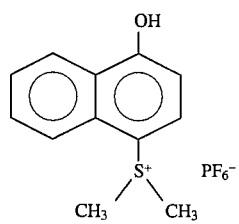
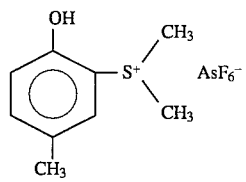
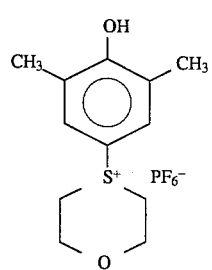
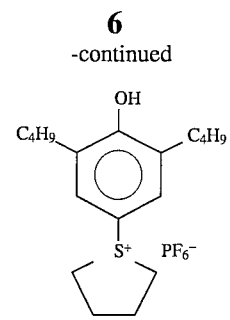
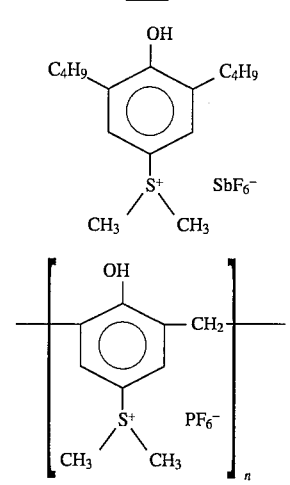
Other suitable photoinitiators are:
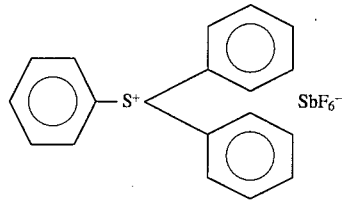
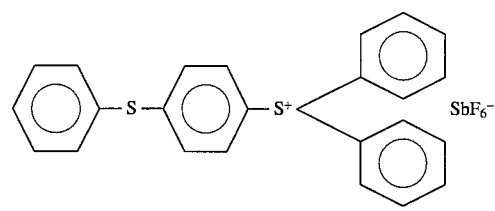
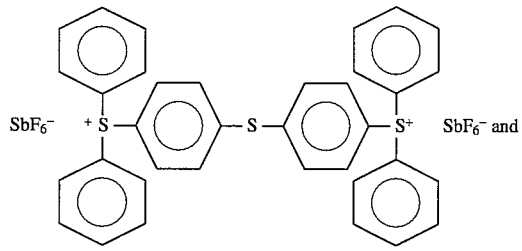

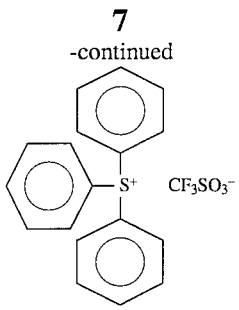

When a negative working photoresist is desired, the photoinitiator employed is one which will generate a Lewis acid upon exposure to actinic light. Examples of such photoinitiators are well-known and include iron arenes. Various suitable photoinitiators are discussed in Meier, et al., "Photoinitiated Cationic Polymerization of Epoxides with Iron-Arene Complexes", *Journal of Radiation Curing*, October 1986, pp. 26–32; Meier, et al., "Imaging with Iron Arene Photoinitiators" *Journal of Imaging Science*, Vol 30, No. 4, July/August 1986, pp. 174–177; Zweifel, et al., "Imaging with Cationic Organometallic Photoinitiators", *Polymer Preprint*, Vol. 26(2), 1985, pp. 347–348; and Meier, "Photopolymerization of Epoxides—A New Class of Photoinitiators Based on Cationic Iron Arene Complexes", *Society of Manufacturing Engineers, Technical Paper FC-85-417*, 1985, disclosures of which are incorporated herein by reference. Examples of some iron arene photoinitiators are represented by the formula:

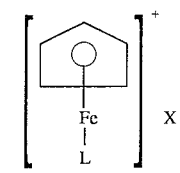

wherein L is an aryl group such as phenyl, naphthyl, and anthracyl; and X is a non-nucleophilic anion such as $SbF_6^-$, $PF_6^-$, $AsF_6^-$, $BF_4^-$, $CF_3SO_3^-$, or $ClO_4^-$. Such iron arenes are commercially available including Ciba-Geigy CG-061 and RD-356.

The photoinitiator employed is present in an amount sufficient to either retard or initiate the polymerization of the cyanate ester, depending upon the type of photoinitiator employed. Usually, the amount of photoinitiator is about 0.5% to about 10% by weight and preferably about 3% to about 5% by weight based upon the solid resin weight.

If desired, the composition can also include a free radical initiator, such as a peroxide including cumyl peroxide, to increase the speed of the photoinitiation. It is believed that free radicals facilitate the decomposition of iron arenes generating acid. When employed, such is usually present in amounts up to about 5% and preferably about 0.005% to about 3% by weight of the solid resin weight.

If desired, in the case of negative photoresists, the compositions can also include catalysts to promote the polymerization of the cyanate ester. Such catalysts include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper actylacetonate or octoates or naphthenates. The amount of catalyst used can vary, and generally will be 0.005 to 5 weight percent, preferably 0.05 to 0.5 weight percent based on total solid resin weight.

Furthermore, if desired, the composition can include one or more photosensitizers. Suitable photosensitizers include perylene(peri-dinaphthalene), anthracene derivatives (ex. 9-methylanthracene), dyes (e.g., acridine orange, acridine yellow, benzoflavin), and titanium dioxide.

When employed, the photosensitizer is usually present in amounts of up to about 3% by weight and preferably about 0.1% to about 1.5% by weight based upon the total solids weight content of the composition.

In addition, the cyanate esters can be blended with organic monomers or polymers including oligomers. The polymers can be thermoplastic or thermosetting. Examples of organic modifiers are epoxies, allylesters, acetylene terminated resins, multifunctional maleimide resins, phenols, monofunctional or multifunctional, polyols, polyetherimides, polyimides, siloxane polyimides, fluorine containing polyimides, polyesters, polyacrylates, polysulfones, polyethersulfones, polycarbonates, polyestercarbonates, and acrylonitrile-butadiene-styrene polymers.

Examples of suitable epoxides containing oxirane ring that can be employed are well-known and are described in E. W. Flick, "Epoxy Resin, Curing Agents, Compounds, and Modifiers" Noyes Publications, Park Ridge, N.J. (1987); in Lee and Nevill "Epoxy Resins" McGraw-Hill (1967); and in U.S. Pat. No. 4,680,341.

Typical examples of epoxy polymers include the epoxidized novolac polymers and the polyepoxides from halo-epoxy alkanes such as epichlorohydrin and a polynuclear dihydric phenol such as bisphenol A. Mixtures of epoxides can be used when desired.

The epoxidized novolac polymers are commercially available and can be prepared by known methods by the reaction of an uncross-linked phenolic aldehyde of a phenol with a halo-epoxy alkane. The phenol can be a mononuclear or polynuclear phenol. Examples of mononuclear phenols have the formula:

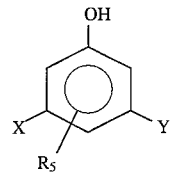

wherein X, Y, and $R_5$ are hydrocarbons containing no more than about 12 carbon atoms.

Hydrocarbon-substituted phenols having two available positions ortho or para to a phenolic hydroxy group for aldehyde condensation to provide polymers suitable for the preparation of epoxy novolacs include o- and p-cresols, o- and p-ethyl phenols, o- and p-isopropyl phenols, o- and p-tert-butyl phenols, o- and p-secbutyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4 -methyl resorcinol, 4-ethyl resorcinol, 4-isopropyl resorcinol, 4-tert-butyl resorcinol, o- and p-benzyl phenol, o- and p-phenethyl phenols, o- and p-phenyl phenols, o- and p-tolyl phenols, o- and p-xylyl phenols, o- and p-cyclohexyl phenols, o- and p-cyclopentyl phenols, 4-phenethyl resorcinol, 4-tolyl resorcinol, and 4-cyclohexyl resorcinol.

Various chloro-substituted phenols which can also be used in the preparation of phenol-aldehyde resins suitable for the preparation of the epoxy novolacs include o- and p-chlorophenols, 2,5-dichloro-phenol, 2,3-dichloro-phenol, 3,4-dichloro-phenol, 2-chloro-3-methyl-phenol 2-chloro-5-methyl-phenol, 3-chloro-2-methyl-phenol, 5-chloro-2-methylphenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,5-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

Examples of polynuclear dihydric phenols are those having the formula:

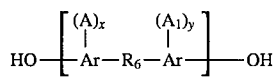

wherein Ar is an aromatic divalent hydrocarbon such as naphthylene and, preferably, phenylene; A and $A_1$ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and $R_6$ is a bond between adjacent carbon atoms as in dihydroxydiphenyl or is a divalent radical including, for example:

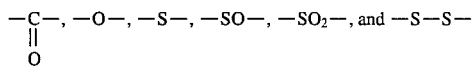

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2'-bis-(4-hydroxyphenyl)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1'-bis-(4-hydroxyphenyl)ethane, 1,2'-bis-(4-hydroxyphenyl)ethane, 1,1'-bis-(4-hydroxy-2-chlorphenyl)ethane, 1,1'-bis(3-methyl-4-hydroxyphenyl) ethane, 1,3'-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis(2-isopropyl4-hydroxyphenyl)pentane, 2,2'-bis-(4-hydroxyphenyl) heptane, bis-(4-hydroxyphenyl)phenylmethane, bis-(4-hydroxyphenyl)cyclohexylmethane, 1,2'-bis-(4-hydroxy-phenyl)-1,2'-bis-(phenyl)propane and 2,2'-bis-(4-hydroxyphenyl)-1-phenyl-propane; di(hydroxyphenyl) sulfones such as bis-(4-hydroxyphenyl)sulfone, 2,4'-dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl) ether, bis-(4-hydroxy-3-bromophenyl)ether, bis-(4-hydroxynaphthyl)ether, bis-(4-hydroxy-3-chloronaphthyl) ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

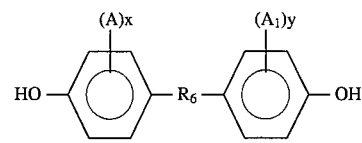

wherein A and $A_1$ are as previously defined, x and y have values from 0 to 4 inclusive and $R_6$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2'-bis(phydroxyphenyl)propane.

As condensing agents, any aldehyde may be used which will condense with the particular phenol being used, including formaldehyde, acetaldehyde, propionaldehyde, butyraldehyde, heptaldehyde,, cyclohexanone, methyl cyclohexanone, cyclopentanone, benzaldehyde, and nuclear alkyl-substituted benzaldehydes, such as toluic aidehyde, naphthaldehyde, furfuraldehyde, glyoxal, acrolein, or compounds capable of engendering aldehydes such as paraformaldehyde, hexamethylene tetramine. The aldehydes can also be used in the form of a solution, such as the commercially available formalin. The preferred aldehyde is formaldehyde.

The halo-epoxy alkane can be represented by the formula:

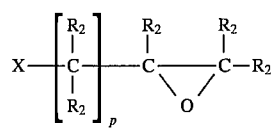

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-2,3-epoxypentane, 2-chloromethyl-1,2epoxybutane, 1-bromo-4-methyl-3,4-epoxypentane, 1-bromo-4-ethyl-2,3-epoxypentane, 4-chloro-2-methyl-2,3epoxypentane, 1-chloro-2,3-epoxyoctane, 1-chloro-2-methyl-2,3-epoxyoctane, or 1-chloro-2,3-epoxydecane.

Although it is possible to use haloepoxyalkanes having a greater number of carbon atoms than indicated above, there is generally no advantage in using those having a total of more than 10 carbon atoms.

Some commercially available epoxy resins include Dow Tactix 742, Shell RSL-1107, Epon 828, Epon 1031, Hi-Tek Polymers Epi-Rez SU-8 and SU-6, Ciba-Geigy Araldite LT 8011, LT8052, LT 8049, LT 8047, CY 8043 and CY 179.

Epi-Rez SU-8 is represented by the following formula:

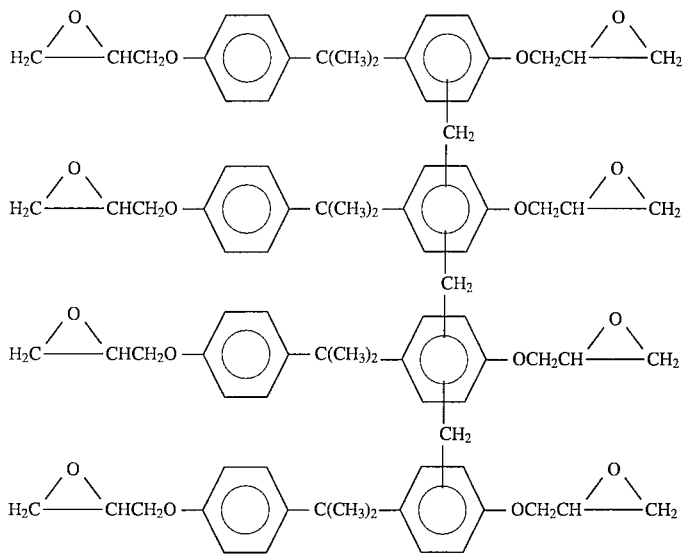

Dow Tactix 742 is represented by the formula:

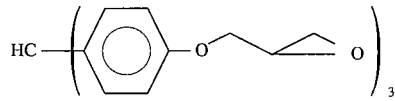

Shell Epon 1031 is represented by the formula:

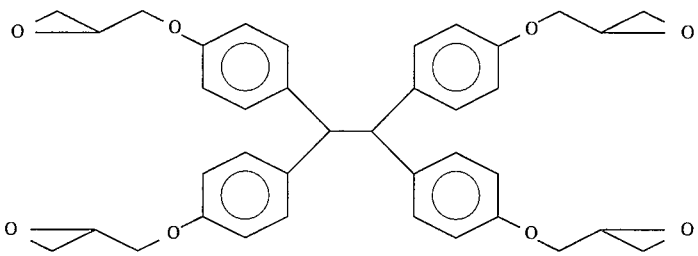

Epoxy polymers containing triazine containing groups are described in U.S. Pat. No. 4,489,202, disclosure of which is incorporated herein by reference.

In addition, the polyepoxides of halo epoxy alkane of the type discussed above and a polynuclear dihydric phenol of the type above can be employed. The preferred polyepoxides of this class being the polyepoxides of epichlorohydrin and bisphenol A (i.e., 2,2-bis(p-hydroxyphenyl)propane. Examples of representative maleimides are commercially available and can be represented by the following structural formula:

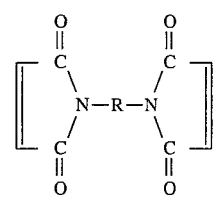

wherein R is a difunctional alkylene radical such as $-(CH_2)_n$ and/or as divalent arylene groups such as

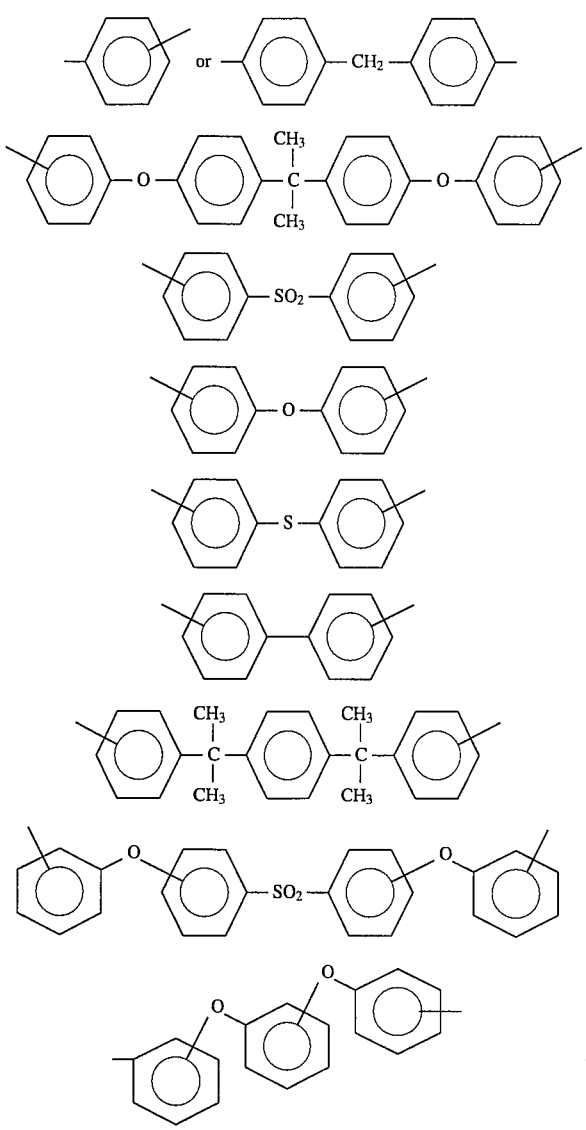

A preferred bismaleimide employed is methylene dianiline bismaleimide, represented by the formula:

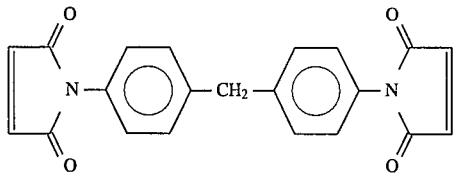

When a maleimide resin is employed, it is desirable to employ a heat-sensitive free radical initiator in order to facilitate the curing. Suitable free radical initiators include peroxides such as dicumyl peroxide and t-butyl perbenzoic peroxide; and azobisisobutyronitrile. When employed, the free radical initiator is present in amounts up to about 0.5% by weight and preferably about 0.005% to about 0.2% by weight based upon the amount of maleimide resin in the composition.

Commercial biscyanate/bismaleimide mixtures are known as BT resins. They are available from Mitsubishi Gas Chemical Co., Inc., Japan.

The organic modifiers, when employed, can be present in amounts of up to about 80% and preferably up to about 60% by weight based upon the total solids content of the composition.

The compositions of the present invention can also include inorganic fillers such as fumed silica, quartz, glass, ceramics, beta-eucryptite, beta-spodumene, sol-gel ceramics and micro-balloons. The inorganic filters can be present in amounts of up to about 75% by weight and preferably about 20% to about 60% by weight based upon the total solids content of the composition.

In addition, the compositions, when desired, can include an organic non-reactive diluent to facilitate the coating operation. Examples of suitable solvents include ketones such as methyl ethyl ketone, methyl isobutyl ketone and methyl amyl ketone, and methylene chloride. When employed, the diluent is present in an amount sufficient to provide compositions for coating application.

The compositions can be coated onto substrates such as metal, composites such as epoxy, cyanate ester, and polyimide based laminates, ceramics, and glass or other materials onto which photoprocessable coatings are normally employed. The compositions can be applied by various known coating techniques such as spinning, spraying, dipping, film laminating or passing the substrate through a bath of the composition.

The compositions after coating onto a substrate and removal of volatile solvents, if present, the coating is imagewise exposed to actinic light and preferably to ultraviolet light radiation in a predetermined pattern with energy ranging from 0.1–5 Joules/cm$^2$. The exposure being through an image-bearing transparency of the desired pattern.

The cyanate ester composition is then subjected to elevated temperatures of about 45° C. to about 150° C. and preferably about 70° C. to about 120° C. This heating is usually carried out for about 5 to about 60 minutes and preferably about 10 to about 45 minutes.

In the case of those compositions acting as negative working photosensitive compositions (those containing a cationic initiator that yields a Lewis acid), the exposure and subsequent heating results in polymerization of those areas of the composition subjected to the actinic light. On the other hand, in the case of those compositions acting as positive working photosensitive (those containing a cationic initiator that yields a Bransted acid), the areas subjected to the actinic light are retarded from polymerizing upon subsequent heating.

After exposure to actinic light and subsequent heating, the coating is developed by removing areas not struck by actinic light in the case of negative resist or by removing areas struck by actinic light in the case of positive resist. This can be accomplished by immersing or spraying the film with a suitable solvent. Some suitable solvents include ketones such as methyl ethyl ketone and methyl isobutyl ketone; methylcarbitol butylcarbitol, methyl chloroform, α-butyrolactone and methyl amyl ketone. The solvent selected is one which will dissolve the uncured cyanate ester composition without attacking, to any undesired extent, the cured composition. Suitable solvents can be readily determined by persons skilled in the art once they are aware of the present disclosure without undue experimentation.

Moreover, when desired, the film can be post-cured by subjecting the films to elevated temperatures such as about 85° C. to about 360° C. and preferably about 150° C. to about 300° C. for about 20 to about 180 minutes.

The negative working photosensitive compositions can also be used as solder mask, permanent resist and imageable dielectric material for use in a multilayer circuit structure.

The following non-limiting examples serve to illustrate preferred embodiments of the present invention and are not intended to limit the teachings as set forth herein.

EXAMPLE 1

A stock cyanate ester composition is prepared by mixing about 100 parts by weight of a 75% solids solution of 2,2-bis(p-cyanatophenyl)-propane) prepolymer in methyl ethyl ketone (available under the trade designation Aro Cy B-40S from Hi-Tek Polymers, Inc., Louisville, Ky.), about 33 parts by weight of methyl ethyl ketone, and about 0.2 parts by weight of solution of zinc octoate (8% zinc) in mineral spirits (available under the trade designation Hex-Cem from Mooney Chemicals Inc., Cleveland, Ohio). To about 10 parts by weight of the above stock cyanate ester composition are added about 0.3 grams of RD-356 photoinitiator from Ciba-Geigy.

A 14 micron dry film is formed by coating the solution by means of a No. 20 wire rod onto an epoxy-fiberglass laminate coupon, followed by drying at 100° C. for 5 minutes in a forced air oven. The resist film is then exposed to about 1.5 Joules/cm$^2$ of U.V. light under a exposed to about 1.5 Joules/cm$^2$ of U.V. light under a glass mask, followed by baking at about 100° C. for about 10 minutes. After being developed in a beaker containing methyl isobutyl ketone, the coupon is heated at about 177° C. for about 30 minutes to achieve further curing. This formulation provides a negative working resist.

EXAMPLE 2

A cyanate ester photosensitive composition is prepared by mixing about 40 parts by weight of a 75% solids solution of 2,2-bis(p-cyanatophenyl)-propane) in methyl ethyl ketone (available under the trade designation Aro Cy B-40S from Hi-Tek Polymers, Inc., Louisville, Ky.), about 0.6 parts by weight of a solution of zinc octoate (8% zinc) in mineral spirits (available under the trade designation Hex-Cem from Mooney Chemicals Inc., Cleveland, Ohio), and about 1.5 parts by weight of RD-356 photoinitiator from Ciba-Geigy.

After mixing, the above solution is coated by means of a wire rod on a piece of 10 mil thick copper and dried in a forced air convection oven for about 15 minutes at about 60° C. The thickness of a dried film is about 1 mil. This sample is exposed through a Stauffer Graphic Arts step wedge and line resolution pattern to 954 mJ/cm$^2$ of U.V. light. Then the sample is baked in an oven at about 100° C. for about 30 minutes, followed by a development in a solution of butyl carbitol/MIBK (75%/25%) for about 2 minutes. The sample is heated at about 250° C. for 30 minutes to achieve further curing. The resultant relief image shows step 5 retained and very good resolution, 1 mil line and 1 mil spaces. This formulation provides a negative working resist.

EXAMPLE 3

A photosensitive composition is prepared by admixing about 50 parts of methyl ethyl ketone, about 20 parts of bismaleimide/cyanic acid ester (available under the trade designation BT-2170 from Mitsubishi Gas Chemical, Inc.), about 15 parts of Araldite LT-8011 epoxy available from Ciba-Geigy, about 15 parts of CY-179 epoxy, and about 5 parts of photoinitiator GEUVE-1014M. The composition is coated onto an epoxy-glass laminate and then dried to remove the methyl ethyl ketone. The sample is then placed under a glass mask and exposed to 2 Joules/cm$^2$ of ultra-violet light. After exposure, the sample is heated in a forced air oven at about 130° C.–155° C. for about 11 minutes. A photoimage is obtained by developing in methyl ethyl ketone with the composition is the exposed area being washed away. The sample is heated at 300° F. for about 30 minutes to complete the curing of the coating.

EXAMPLE 4

Example 3 is repeated, except that composition contains about 3 parts by weight of Araldite LT 8011, about 7 parts by weight of BT-2170, and about 5 parts by weight of GEUVE-1014M. The composition acts as a positive resist.

Having thus described our invention, what we claim as new and desire to secure by Letters Patent is:

1. A positive photosensitive composition containing a curable cyanate ester or a prepolymer thereof and a cationic photoinitiator that generates a Bronsted acid upon exposure to actinic light wherein said cyanate ester is a polyaromatic cyanate ester containing cycloaliphatic bridging group between aromatic rings.

2. The photosensitive composition of claim 1 wherein said photoinitiator is an onium salt of a Group VIA or a Group VIIA element.

3. The photosensitive composition of claim 1 wherein said photoinitiator is a sulfonium salt.

4. The photosensitive composition of claim 1 wherein said photoinitiator is present in an amount of about 0.5% to about 10% by weight based upon the solid resin weight.

5. The photosensitive composition of claim 1 wherein said photoinitiator is present in an amount of about 3% to about 5% by weight based upon the solid resin weight.

6. The photosensitive composition of claim 1 which further contains up to about 5% by weight based upon the solid resin weight of a free radical initiator.

7. The photosensitive composition of claim 1 wherein said cyanate ester is a prepolymer.

8. The photosensitive composition of claim 1 which further includes a photosensitizer.

9. The photosensitive composition of claim 1 which further includes an organic monomer or organic polymer, or both.

10. The photosensitive composition of claim 9 wherein said organic polymer is an epoxy polymer.

11. The photosensitive composition of claim 9 wherein said organic monomer is a maleimide.

12. The photosensitive composition of claim 11 wherein said maleimide is represented by the following formula:

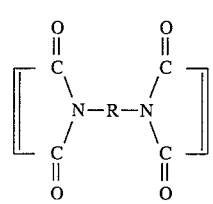

wherein R is a divalent alkylene radical or a divalent arylene group.

13. The photosensitive composition of claim 12 wherein said maleimide is methylene dianiline bismaleimide.

14. The photosensitive composition of claim 12 which further includes a free radical initiator.

15. The photosensitive composition of claim 11 which further includes an inorganic filler.

* * * * *